United States Patent
Taylor

(12) United States Patent (10) Patent No.: US 8,081,467 B2
Taylor (45) Date of Patent: Dec. 20, 2011

(54) ELECTRONICS PACKAGE INCLUDING HEAT SINK IN THE HOUSING AND RELATED METHODS

(75) Inventor: Edward Allen Taylor, West Melbourne, FL (US)

(73) Assignees: SRI Hermetics Inc., West Melbourne, FL (US); H-Tech, LLC, West Melbourne, FL (US)

( * ) Notice: Subject to any disclaimer, the term of this patent is extended or adjusted under 35 U.S.C. 154(b) by 204 days.

(21) Appl. No.: 12/195,079

(22) Filed: Aug. 20, 2008

(65) Prior Publication Data

US 2010/0046172 A1 Feb. 25, 2010

(51) Int. Cl.
*H05K 7/20* (2006.01)

(52) U.S. Cl. ........ 361/710; 361/704; 361/707; 257/706; 257/720; 428/614

(58) Field of Classification Search .................. 361/688, 361/690, 700, 704, 710, 714
See application file for complete search history.

(56) References Cited

U.S. PATENT DOCUMENTS

| | | | | |
|---|---|---|---|---|
| 5,525,835 A * | 6/1996 | Nishiguchi | | 257/712 |
| 6,028,355 A * | 2/2000 | Gates | | 257/706 |
| 6,148,899 A * | 11/2000 | Cornie et al. | | 164/65 |
| 6,355,362 B1 | 3/2002 | Jones et al. | | 428/614 |
| 6,854,985 B1 * | 2/2005 | Weiss | | 439/91 |
| 6,918,437 B2 | 7/2005 | Eytcheson et al. | | 165/185 |
| 6,922,518 B2 | 7/2005 | Esposito | | 385/138 |
| 7,123,440 B2 | 10/2006 | Albrecht et al. | | 360/97.02 |
| 7,365,620 B2 | 4/2008 | Taylor | | 333/252 |
| 7,459,112 B2 * | 12/2008 | Chu et al. | | 264/160 |
| 2003/0024611 A1 * | 2/2003 | Cornie et al. | | 148/420 |
| 2007/0139895 A1 * | 6/2007 | Reis et al. | | 361/719 |
| 2008/0265403 A1 * | 10/2008 | Cornie et al. | | 257/706 |
| 2009/0321130 A1 * | 12/2009 | Greer et al. | | 174/526 |

* cited by examiner

*Primary Examiner* — Courtney Smith
(74) *Attorney, Agent, or Firm* — Allen, Dyer, Doppelt, Milbrath & Gilchrist, P.A.

(57) ABSTRACT

An electronics package may include a housing and electronic circuitry carried thereby. The housing may include a first metallic material having a first coefficient of thermal expansion (CTE) and having an array of openings therein. The electronics package may also include a thermally conductive body within each of the openings in the array thereof to thereby define a heat sink for the electronic circuitry. Each of the thermally conductive bodies may include a second metallic material having a second CTE substantially different from the first CTE.

17 Claims, 5 Drawing Sheets

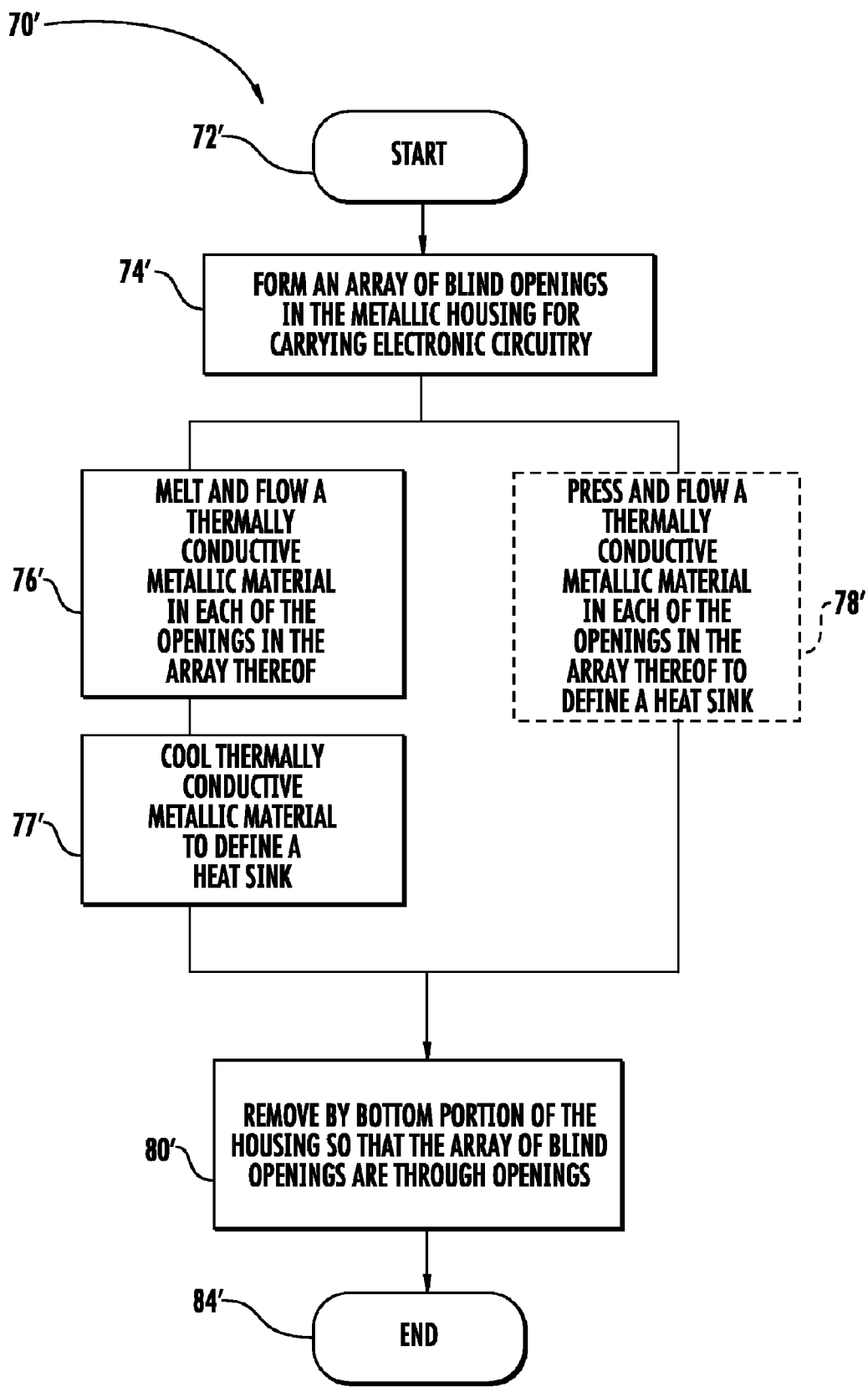

ELECTRONICS PACKAGE INCLUDING HEAT SINK IN THE HOUSING AND RELATED METHODS

FIELD OF THE INVENTION

The present invention relates to the field of electronics packages, and, more particularly, to heat-dissipating electronics packages and related methods.

BACKGROUND OF THE INVENTION

An electronics package typically includes a box-like structure or housing, in the interior of which electronic circuitry is mounted. The electronics package is desirably constructed from materials that meet specific functional requirements for density, thermal expansion, thermal conductivity, mechanical strength, and the like. For example, an electronics package used in aircraft and spacecraft may be lightweight and therefore may be constructed from low-density materials.

Additionally, in some environments, a hermetic seal of the electronics package may be desirable. In this and other environments, it may be particularly useful to use a heat sink, so that heat may be dissipated from the electronic circuitry within the housing. One approach involves coupling a metallic heat sink to the electronics package. For example, a heat sink may be mounted into the floor of the electronics package.

U.S. Pat. No. 6,355,362 to Jones et al. discloses an electronics package including a housing that has a metallic material of a first relatively low coefficient of thermal expansion (CTE). A metallic heat sink is mounted in a floor of the housing and has a second CTE that substantially matches the first CTE to reduce stress in the housing during temperature extremes. Special alloys are used to match the CTEs. Additionally, mounting the heat sink in the floor of the electronics package involves forming the heat sink and fitting it into an opening within the housing. This process may be cumbersome, time consuming, and costly.

SUMMARY OF THE INVENTION

In view of the foregoing background, it is therefore an object of the present invention to provide an electronics package including one or more heat sinks that is efficient and readily manufactured.

This and other objects, features, and advantages in accordance with the present invention are provided by an electronics package that may include a housing and electronic circuitry carried thereby. The housing may include a first metallic material having a first coefficient of thermal expansion (CTE) and having an array of openings therein. The electronics package may also include a thermally conductive body within each of the openings in the array thereof to thereby define a heat sink for the electronic circuitry, for example. Each of the thermally conductive bodies may include a second metallic material having a second CTE substantially different from the first CTE. Accordingly, materials may be used that have desirable properties, such as high thermal conductivity and/or light weight.

The second CTE may be substantially greater than the first CTE. The second CTE may also be greater than the first CTE by at least 7.5 in $10^{-6}/°$ K, for example.

The array of openings in the housing may define a honeycomb pattern. Each opening of the array thereof may have a cylindrical shape, for example. Additionally, each opening of the array thereof may extend through the housing.

The second material may have a higher thermal conductivity than the first material, and the first material may have a higher melting point than the second material. The first material may include at least one of titanium, iron-nickel, stainless steel or kovar. The second material may include at least one of aluminum, copper, magnesium, or aluminum-berylium. The housing may be a hermetically sealable housing, for example.

Another aspect is directed to a method of making an electronics package. The method may include forming a housing that includes a first metallic material having a first coefficient of thermal expansion (CTE) and having an array of openings therein. The method may further include forming a thermally conductive body within each of the openings in the array thereof to thereby define a heat sink for electronic circuitry carried by the housing, for example. Each of the thermally conductive bodies may include a second metallic material having a second CTE substantially different from the first CTE.

In one embodiment, the method may include forming an array of openings in a metallic housing for carrying electronic circuitry, for example. The method may also include flowing a thermally conductive metallic material in each of the openings in the array thereof to thereby define a heat sink for the electronic circuitry.

BRIEF DESCRIPTION OF THE DRAWINGS

FIG. 5 is a flow chart for yet another embodiment of a method of making the electronics package in accordance with the present invention.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

Figure 1:
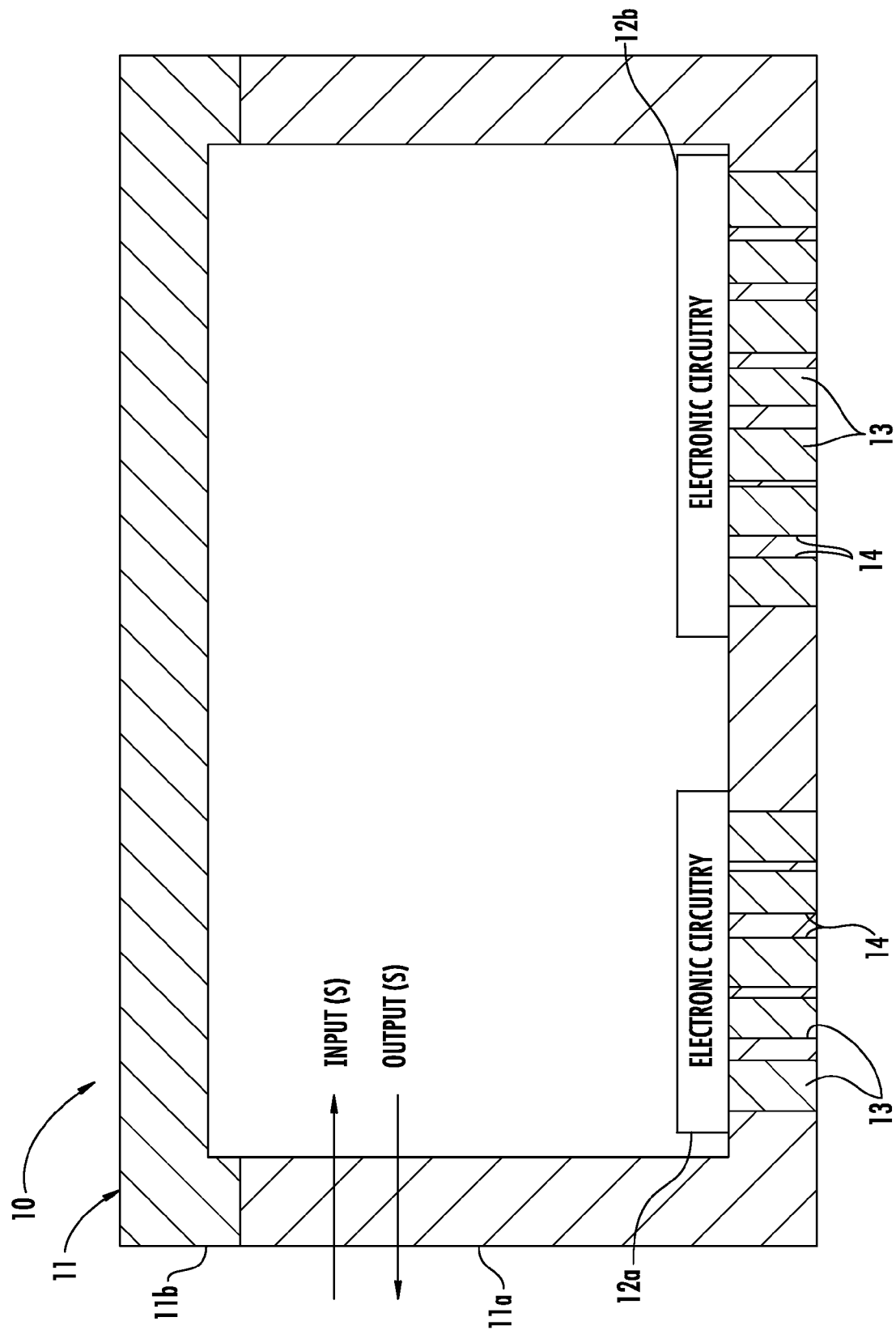
FIG. 1 is a longitudinal cross-sectional view of an electronics package in accordance with the present invention.
Figure 2:
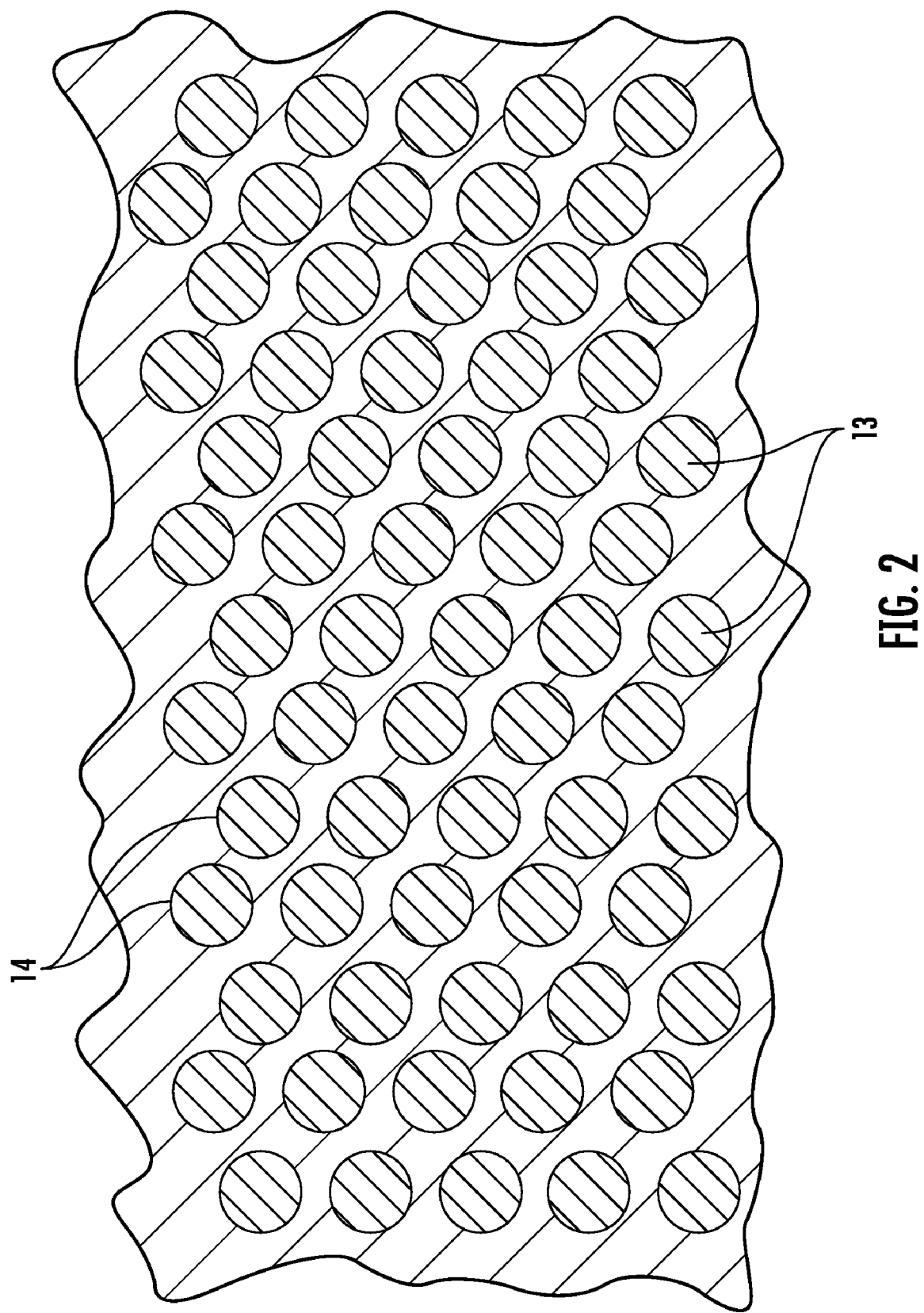
FIG. 2 is an enlarged transverse cross-sectional view of a portion of the electronics package in FIG. 1.

Referring initially to FIGS. 1 and 2, an electronics package 10 illustratively includes a housing 11, in turn, comprising a bottom 11a and a lid 11b hermetically sealed thereto and electronic circuitry 12 carried thereby. The housing 11 may include one or more input and output ports or connectors/feedthroughs for accessing the electronic circuitry 12 from outside the housing as will be appreciated by those skilled in the art.

The housing 11 comprises a first metallic material having a first coefficient of thermal expansion (CTE) and having an array of openings 14 therein. More particularly, the housing 11 may be titanium that is a reduced weight material that exhibits high mechanical strength, which makes it a particularly useful material in aerospace vehicles, for example. Additionally, titanium has a CTE of about 8.5. It should be noted that other housing materials may be used, for example, iron-nickel, stainless steel, kovar and others, as will be appreciated by those skilled in the art. One drawback of titanium, as well as the other housing materials noted above, is that it has a reduced thermal conductivity when compared to other metallic materials.

As noted above, the housing 11 illustratively includes two arrays of openings 14 therein as seen in the left and right hand portions of FIG. 1. Each opening 14 of an array illustratively extends through the housing 11. An array of openings 14 may be selectively configured to match the placement of the electronic circuitry 12. Additionally, there may be more than two arrays of openings 14 or even a single array of openings.

As illustrated, perhaps best in FIG. 2, the array of openings 14 in the housing defines a honeycomb pattern. The honeycomb pattern, which is illustratively a uniformly spaced pattern with nested adjacent rows and/or nested adjacent columns, advantageously increases the footprint of the openings and reduces the impact to the mechanical strength of the housing 11 by the array of openings 14, as compared to other spacing patterns, as will be appreciated by those skilled in the art. More particularly, increased strength is particularly advantageous in harsher environments where there are more extreme temperatures, increased vibrations and stresses, as in an aerospace application, for example.

Each opening of the array of openings 14 illustratively has a cylindrical shape. The cylindrical shape provides for easier fabrication of the electronics package 10 and avoids sharp corners where stress can occur. However, other opening shapes may also be used. Additionally, for example, each opening 14 in the array of openings may be approximately 0.063 inches in diameter. These small size openings advantageously maintain the xy structure of the first metallic material. Thus, the impact to the mechanical strength of the housing 11 by the array of openings 14 is reduced, as compared to larger sized openings. Other size diameter openings may be made.

A thermally conductive body 13 is illustratively within each of the openings 14 in the array thereof to thereby define a heat sink for the electronic circuitry 11. Each of the thermally conductive bodies 13 comprises a second metallic material having a second GTE substantially different from the first CTE. More particularly, the second metallic material may be aluminum. The GTE of the second metallic material is substantially greater than the first CTE. In particular, the CTE of the aluminum is greater than the titanium CTE by at least 7.5 in $10^{-6}/°K$. The thermally conductive bodies 13 may be other metallic materials, such as copper, magnesium, or aluminum-beryllium, for example, as will be appreciated by those skilled in the art. Table 1 below illustrates several examples of first and second metallic material combinations.

TABLE 1

| First Metallic Material | CTE | Second Metallic Material | CTE | CTE Difference |
| --- | --- | --- | --- | --- |
| Titanium | 8.5 | Magnesium | 28 | 19.5 |
| Titanium | 8.5 | Aluminum | 23 | 14.5 |
| Titanium | 8.5 | Aluminum-Beryllium | 18 | 9.5 |
| Stainless Steel | 10 | Copper | 17.5 | 7.5 |
| Alloy 42 | 5 | Copper | 17.5 | 12.5 |
| Alloy 46 | 7 | Copper | 17.5 | 10.5 |
| Alloy 48 | 8 | Copper | 17.5 | 9.5 |
| Alloy 52 | 10 | Copper | 17.5 | 7.5 |
| Kovar | 5.5 | Copper | 17.5 | 12 |

TABLE 1-continued

Advantageously, the second metallic material, such as aluminum, has a higher thermal conductivity than the first metallic material. Having a higher thermal conductivity, the second metallic material conducts an increased amount of heat as compared to the first metallic material of the housing 11. Accordingly, heat generated from the electronic circuitry 12 carried by the housing 11 is efficiently removed, thus maintaining a lower operating temperature for the electronic circuitry to thereby increase its service life.

The first metallic material may preferably have a higher melting point than the second metallic material. The first metallic material is advantageously with the second metallic material at a melting point of the second metallic material to facilitate a manufacturing approach described in greater detail below. Being metallurgically compatible may also be advantageous in a hermetic environment for maintaining a hermetic seal. For example, the first metallic material, titanium, is typically metallurgically compatible with aluminum.

Because expansion rates, measured by the CTE of a material, and stresses to the material are linear, using a relatively small sized thermally conductive body 13 in the array advantageously overcomes problems associated with CTE mismatches.

As will be appreciated by those skilled in the art, by allowing the substantially different CTEs between the first metallic material and the second metallic material, exotic and specialized alloys may not be needed. For example, copper is often alloyed with tungsten, or copper is often alloyed with molybdenum to reduce the overall CTE. Not having to create special alloys advantageously reduces production costs and does not adversely affect other factors, such as thermal conductivity, and mechanical strength, for example. In other words, the first and second material may be chosen to increase thermal conductivity, mechanical strength, and limit reactivity without regard to substantially matching CTEs.

Figure 3:
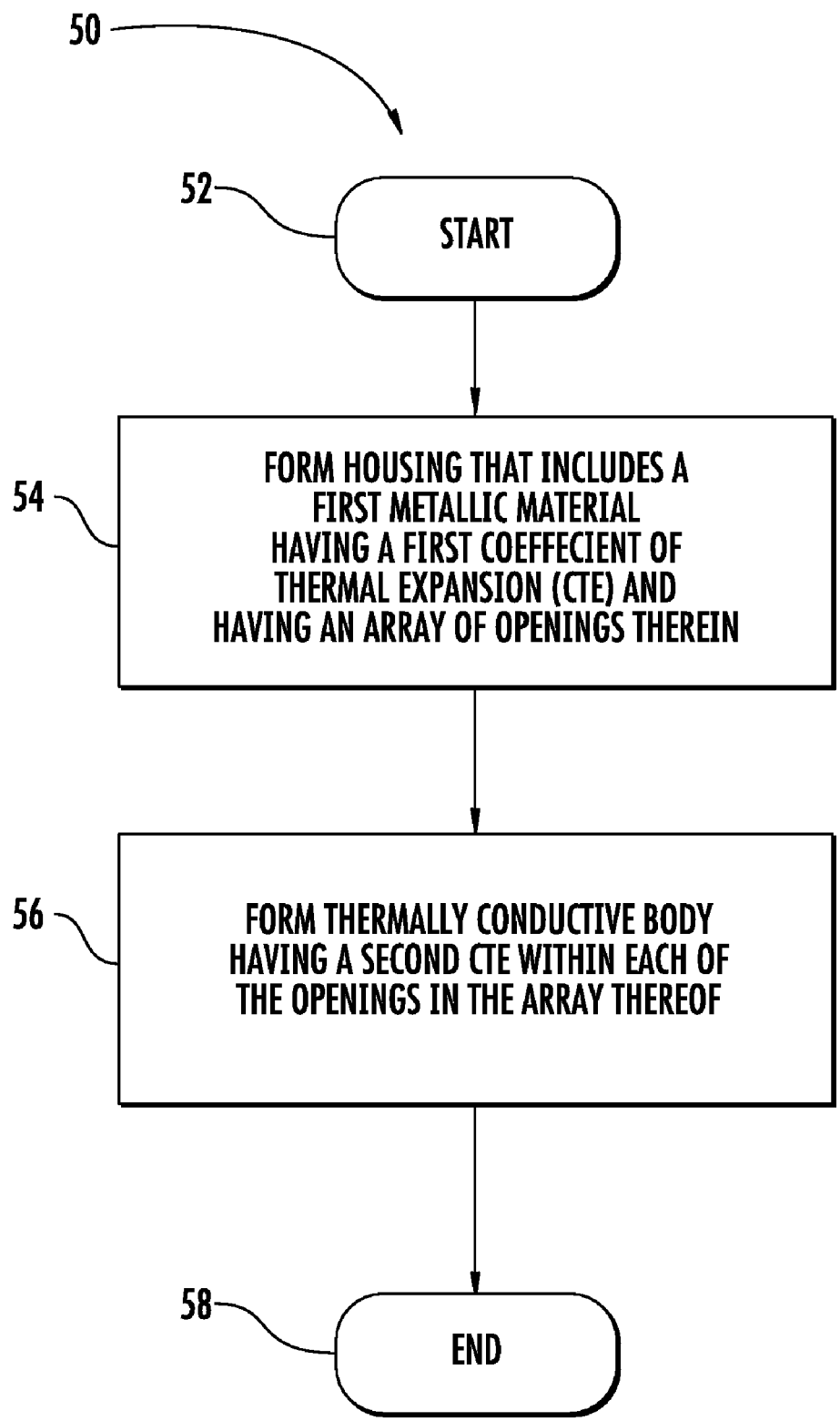
FIG. 3 is a flow chart for a method of making an electronics package in accordance with the present invention.

Referring now additionally to FIG. 3, with reference to the flowchart 50, a method for making the electronics package 10 is now described. Beginning at Block 52, the method includes forming the housing 11 that includes a first metallic material having a first coefficient of thermal expansion (CTE) and having an array of openings 14 therein (Block 54). The array of openings 14 may be formed by drilling, for example. As will be appreciated by those skilled in the art, the array of openings 14 may be formed using other methods, for example, sinker EDM, carbon blast, water jet, or laser.

The method also includes forming the thermally conductive body 13 within each of the openings 14 in the array thereof to thereby define a heat sink for electronic circuitry 12 carried by the housing 11 (Block 56) before ending at Block 58. Each of the thermally conductive bodies 13 includes a second metallic material having a second CTE substantially different from the first CTE. The method steps may be performed in a vacuum to prevent oxidation of the first and second metallic materials, as will be appreciated by those skilled in the art.

Figure 4:
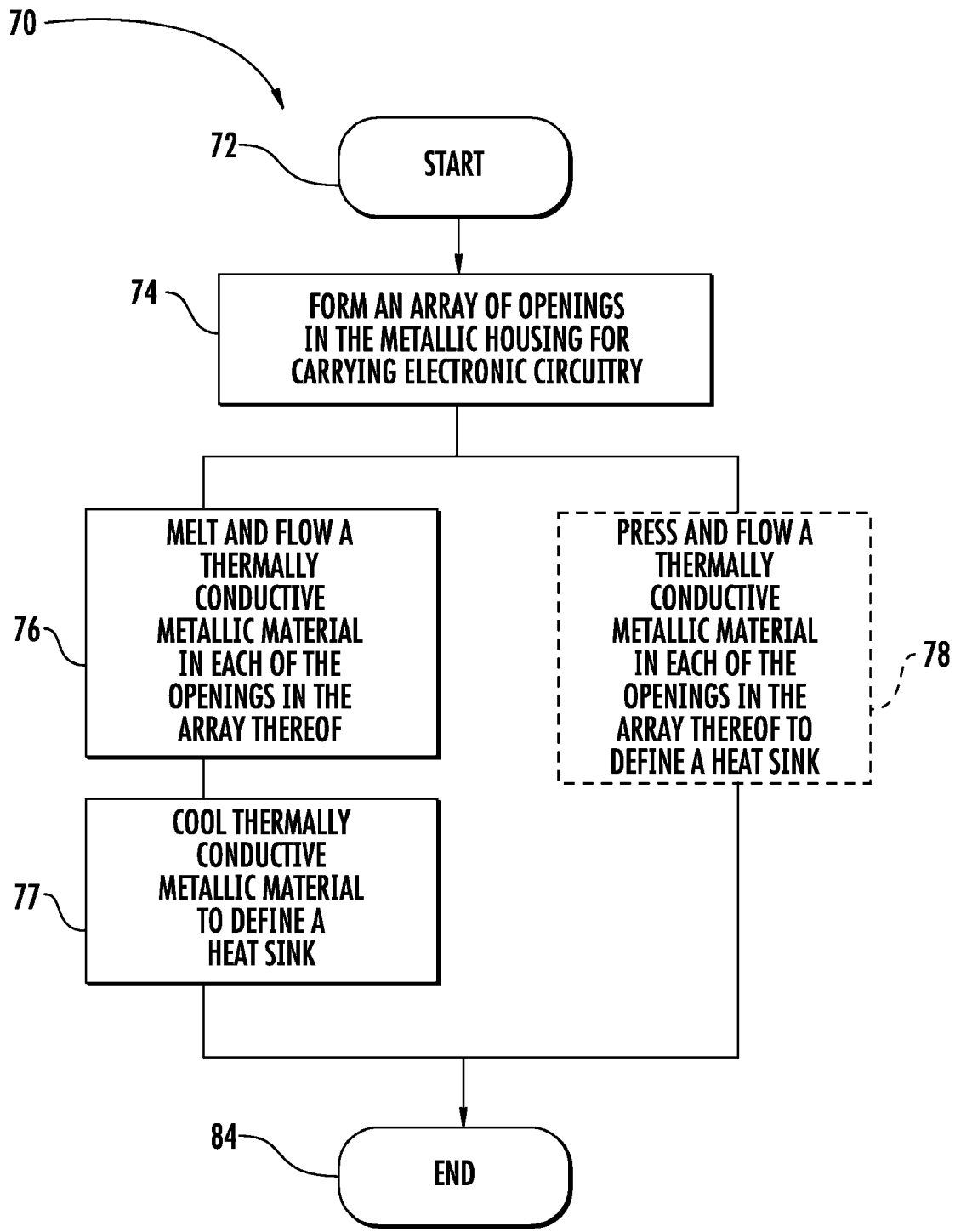
FIG. 4 is a flow chart for another embodiment of a method of making an electronics package in accordance with the present invention.

Referring now to FIG. 4, with reference to the flowchart 70, another embodiment of a method of making the electronics package 10 is described. Beginning at Block 72, the method includes forming an array of openings in the metallic housing 11 for carrying electronic circuitry 12 (Block 74). The array of openings 14 may be formed using any of the techniques described above, or other techniques may be used.

The method further includes flowing a thermally conductive metallic material 13 in each of the openings 14 in the array thereof to thereby define a heat sink. One technique of flowing the thermally conductive metallic material 13 includes at Block 76 melting and flowing the thermally conductive metallic material. Once melted, the thermally conductive metallic material 13 may flow into each of the openings 14 in the array thereof. Still further, the housing 11 may be floated on a bath of melted thermally conductive metallic material. The melted thermally conductive metallic material 13 is cooled at Block 77 to thereby define a heat sink for the electronic circuitry 12 before ending at Block 84.

Alternatively, another technique of flowing the thermally conductive metallic material 13 includes pressing and flowing at Block 78 the thermally conductive metallic material 13 to thereby define a heat sink before ending at Block 84. Pressing may be accomplished by applying pressure to the thermally conductive metallic material 13 in a vacuum, for example, of course, other melting and flowing techniques may be used, as will be appreciated by those skilled in the art. It should be noted that while the above melting/flowing and pressing/flowing techniques are particularly advantageous for flowing a thermally conductive metallic material 13 having a substantially different CTE than the metallic housing 11, in other embodiments these techniques may be applied to metallic materials having substantially similar CTEs.

Referring now to FIG. 5, in another embodiment, the array of openings 14 may be blind openings. In other words, the array of cylindrical openings 14 does not extend all the way through the housing 11. In addition to the method steps described above with regard to FIG. 4, a lower portion of the housing 11 is removed by machining or other removal technique (Block 80') before finishing at Block 84'. After removal of the lower portion, each opening 14 of the array thereof is exposed to define a through opening having the thermally conductive metallic material therein. As noted above, the method steps may be performed in a vacuum to prevent oxidation of the metallic housing 11 and thermally conductive metallic material 13, as will be appreciated by those skilled in the art.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An electronics package comprising:
   a housing and electronic circuitry carried within said housing;
   said housing comprising a first metallic material so that said housing has a first coefficient of thermal expansion (CTE) and has an array of openings therein; and
   a thermally conductive body within each of the openings in the array thereof to thereby define a heat sink for said electronic circuitry;
   each of said thermally conductive bodies comprising a second metallic material so that each thermally conductive body has a second CTE greater than the first CTE by at least 7.5 in $10^{-6}/° K$.

2. The electronics package according to claim 1 wherein each opening of the array thereof has a cylindrical shape.

3. The electronics package according to claim 1 wherein each opening of the array thereof extends through said housing.

4. The electronics package according to claim 1 wherein said second material has a higher thermal conductivity than said first material.

5. The electronics package according to claim 1 wherein said first material has a higher melting point than said second material.

6. The electronics package according to claim 1 wherein said first material comprises at least one of titanium, iron-nickel, stainless steel, or kovar.

7. The electronics package according to claim 1 wherein said second material comprises at least one of aluminum, copper, magnesium, or aluminum-berylium.

8. The electronics package according to claim 1 wherein said housing comprises a hermetically sealable housing.

9. An electronics package comprising:
   a housing and electronic circuitry carried within said housing;
   said housing comprising a first metallic material so that said housing has a first coefficient of thermal expansion (CTE) and has an array of openings therein arranged in a honeycomb pattern; and
   a thermally conductive body within each of the openings in the array thereof to thereby define a heat sink for said electronic circuitry;
   each of said thermally conductive bodies comprising a second metallic material so that each thermally conductive body has a second CTE greater than the first CTE by at least 7.5 in $10^{-6}/° K$.

10. The electronics package according to claim 9 wherein each opening of the array thereof has a cylindrical shape.

11. The electronics package according to claim 9 wherein each opening of the array thereof extends through said housing.

12. The electronics package according to claim 9 wherein said second material has a higher thermal conductivity than said first material; and wherein said first material has a higher melting point than said second material.

13. The electronics package according to claim 9 wherein said housing comprises a hermetically sealable housing.

14. A method of making an electronics package comprising:
   forming a housing comprising a first metallic material so that the housing has a first coefficient of thermal expansion (CTE) and has an array of openings therein; and
   forming a thermally conductive body within each of the openings in the array thereof to thereby define a heat sink for electronic circuitry carried within the housing;
   each of the thermally conductive bodies comprising a second metallic material so that each thermally conductive body has a second CTE greater than the first CTE by at least 7.5 in $10^{-6}/° K$.

15. The method according to claim 14 wherein the array of openings in the housing defines a honeycomb pattern.

16. The method according to claim 14 wherein each opening of the array thereof has a cylindrical shape; and wherein each opening of the array thereof extends through the housing.

17. The method according to claim 14 wherein the second material has a higher thermal conductivity than the first material; and wherein the first material has a higher melting point than the second material.

* * * * *

UNITED STATES PATENT AND TRADEMARK OFFICE
CERTIFICATE OF CORRECTION

PATENT NO.        : 8,081,467 B2
APPLICATION NO.   : 12/195079
DATED             : December 20, 2011
INVENTOR(S)       : Edward Allen Taylor It is certified that error appears in the above-identified patent and that said Letters Patent is hereby corrected as shown below:

Column 3, Line 44    Delete: "GTE"
                     Insert: --CTE--

Column 3, Line 46    Delete: "GTE"
                     Insert: --CTE--

Signed and Sealed this
Twenty-third Day of October, 2012

David J. Kappos
Director of the United States Patent and Trademark Office